(12) United States Patent
Hermes et al.

(10) Patent No.: US 7,358,568 B2
(45) Date of Patent: *Apr. 15, 2008

(54) LOW RESISTANCE SEMICONDUCTOR PROCESS AND STRUCTURES

(75) Inventors: Michael J. Hermes, Boise, ID (US); Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/305,598

(22) Filed: Dec. 16, 2005

(65) Prior Publication Data

US 2006/0097327 A1    May 11, 2006

Related U.S. Application Data

(60) Continuation of application No. 10/305,465, filed on Nov. 26, 2002, now Pat. No. 6,977,418, which is a division of application No. 09/146,639, filed on Sep. 3, 1998, now Pat. No. 6,486,060.

(51) Int. Cl.
    *H01L 29/76* (2006.01)
(52) U.S. Cl. .................................. 257/342
(58) Field of Classification Search ........ 257/314–317, 257/342, 392, 411–412, E21.439
    See application file for complete search history.

(56) References Cited

U.S. PATENT DOCUMENTS

| | | | |
|---|---|---|---|
| 5,198,384 A | 3/1993 | Dennison | 437/47 |
| 5,262,343 A | 11/1993 | Rhodes et al. | 438/3 |
| 5,381,302 A | 1/1995 | Sandhu et al. | 361/305 |
| 5,422,296 A | 6/1995 | Lage | 438/212 |
| 5,536,683 A | 7/1996 | Lin et al. | 438/639 |
| 5,627,093 A | 5/1997 | Hachisuka et al. | 438/649 |
| 5,854,127 A | 12/1998 | Pan | 438/629 |
| 5,899,742 A | 5/1999 | Sun | 438/682 |
| 5,998,257 A | 12/1999 | Lane et al. | 438/253 |
| 6,013,547 A | 1/2000 | Liaw | 438/238 |
| 6,066,881 A | 5/2000 | Shimizu et al. | 257/392 |
| 6,096,638 A | 8/2000 | Matsubara | 438/649 |
| 6,175,146 B1 | 1/2001 | Lane et al. | 257/635 |
| 6,261,899 B1 | 7/2001 | Lane et al. | 438/253 |
| 6,277,758 B1 | 8/2001 | Ko | 438/706 |
| 6,294,420 B1 | 9/2001 | Tsu et al. | 438/239 |
| 6,340,611 B1 * | 1/2002 | Shimizu et al. | 438/201 |
| 6,438,028 B1 * | 8/2002 | Kobayashi et al. | 365/185.05 |
| 6,486,060 B2 | 11/2002 | Hermes et al. | 438/649 |
| 6,551,940 B1 | 4/2003 | Ko | 438/714 |
| 6,693,335 B2 * | 2/2004 | Gonzalez et al. | 257/410 |
| 6,849,557 B1 | 2/2005 | Ko | 438/738 |

* cited by examiner

*Primary Examiner*—Nathan W Ha

(57) ABSTRACT

A process for forming a semiconductor device comprises the steps of providing a semiconductor substrate assembly comprising a semiconductor wafer having an active area formed therein, a plurality of transistor gates each having a TEOS cap thereon and a pair of nitride spacers along each gate, a plurality of conductive plugs each contacting the wafer, and a BPSG layer overlying the transistor gates and contacting the active area. A portion of the BPSG layer is etched thereby exposing the TEOS caps. A portion of the BPSG layer remains on the active area after completion of the etch. Subsequently, a portion of the TEOS caps are removed to expose the transistor gates and a titanium silicide layer is formed simultaneously to contact the transistor gates and the plugs. An inventive structure resulting from the inventive process is also described.

10 Claims, 3 Drawing Sheets

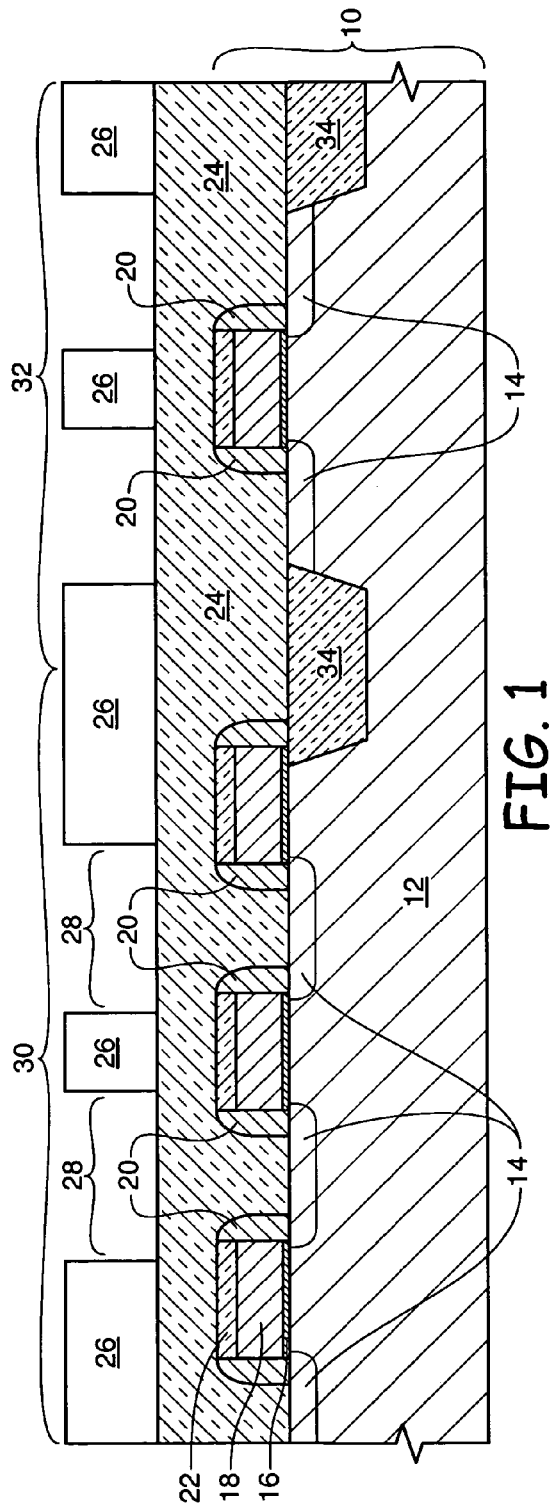
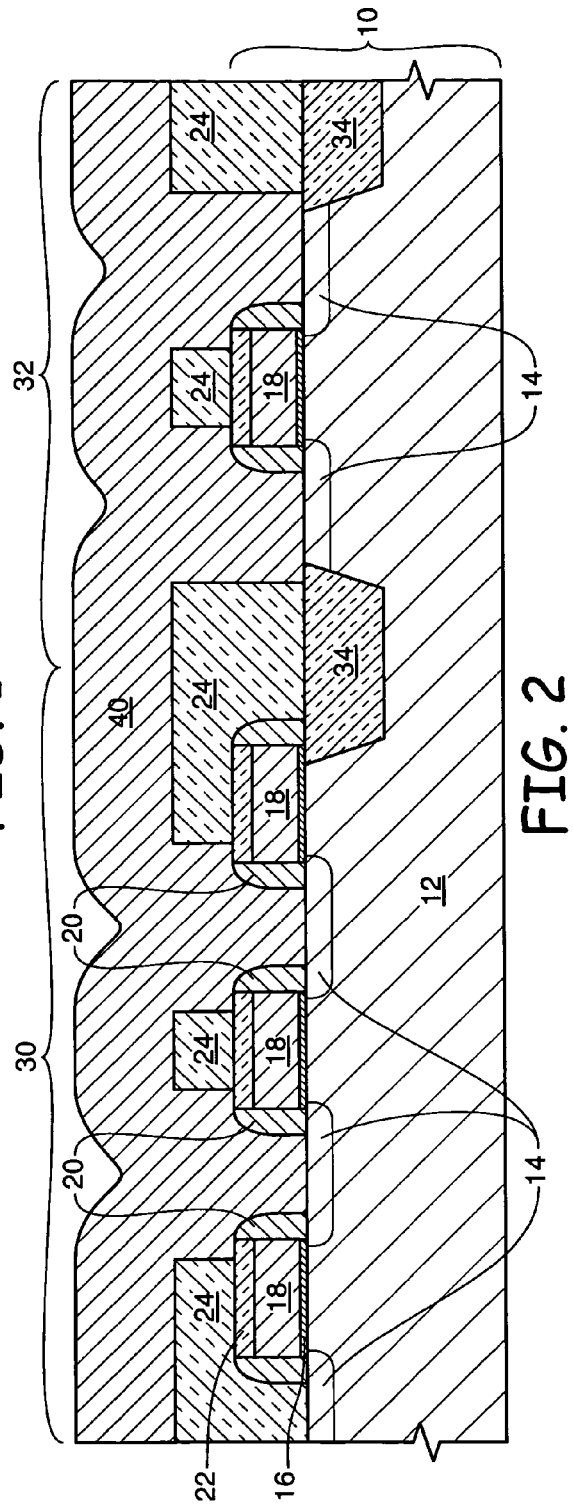

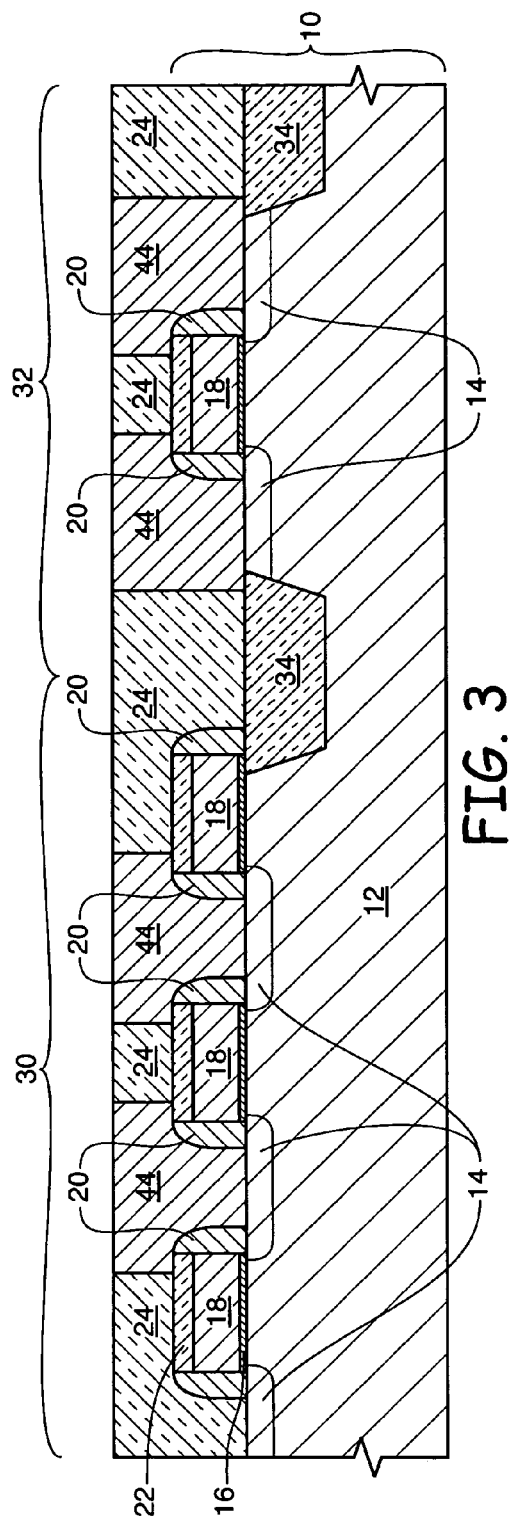
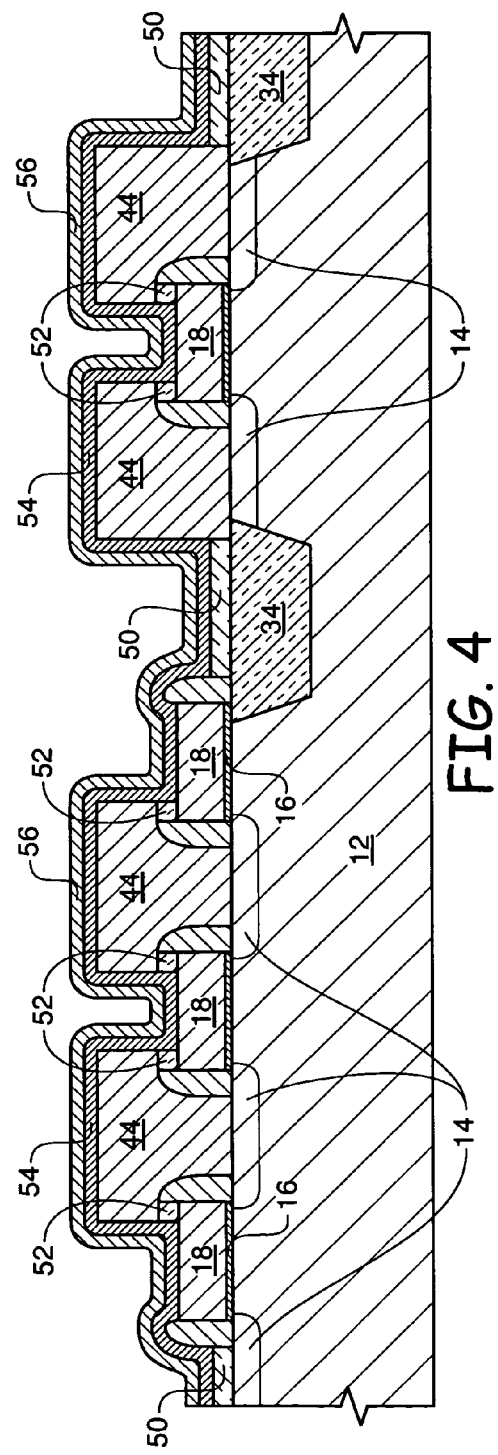

LOW RESISTANCE SEMICONDUCTOR PROCESS AND STRUCTURES

This is a continuation of U.S. Ser. No. 10/305,465 filed Nov. 26, 2002 and issued Dec. 20, 2005 as U.S. Pat. No. 6,977,418, which is a division of U.S. Ser. No. 09/146,639 filed Sep. 3, 1998 and issued Nov. 26, 2002 as U.S. Pat. No. 6,486,060.

FIELD OF THE INVENTION

This invention relates to the field of semiconductor assembly, and more particularly to a process for forming conductive structures having enhanced conductivity, and the in-process structure resulting from the process.

BACKGROUND OF THE INVENTION

Structures such as polycrystalline silicon (poly) plugs, interconnects, and transistor gates are commonly formed during the manufacture of semiconductor devices such as microprocessors, memory devices, and logic devices. To manufacture a plug, for example, a masked dielectric layer is formed over an underlying substrate assembly and an etch is completed to form a hole in the dielectric which exposes the underlying structure in the area where contact is to be made. A blanket poly layer is deposited over the dielectric layer which fills the hole in the dielectric layer and contacts the underlying structure. The poly is then removed from a planar surface of the dielectric, typically using a chemical mechanical polishing (CMP) process which leaves the plug formed within the dielectric layer. Interconnects and gates are typically formed by depositing a blanket layer of poly over a semiconductor substrate assembly, then masking and etching the layer.

As the sizes of the plugs and line widths decrease with improving manufacturing technology, the doped poly structure may provide excessive resistance and insufficient conductance. To reduce the resistance of a structure, a silicide layer is often formed underneath the plug or over the top of the plug, gate or interconnect. To form the silicide layer to enhance plug conductivity the silicide layer can be formed before formation of the plug. A titanium chemical vapor deposition (CVD) process results in titanium reacting with the exposed silicon wafer to form titanium silicide. An unreacted titanium metal layer will also form over any exposed dielectric layer which is then stripped. After stripping the unreacted titanium, the poly plugs are formed over the silicide layer as described above.

A silicide layer can also be formed over the plug, transistor gate or other interconnect after forming the blanket poly layer which forms the gate or interconnect. During a titanium CVD process similar to that described above for forming silicide under the plug, the titanium reacts with the polysilicon to form silicide on top of the poly layer, then the poly is masked and etched to define the line or plug.

U.S. Pat. No. 5,381,302 by Sandhu et al. and U.S. Pat. No. 5,198,384 by Dennison, each assigned to Micron Technology, Inc. and incorporated herein by reference in their entirety, describe a process for forming a silicide layer over a poly plug.

While the silicide layer interposed between the silicon wafer and the poly plug provides decreased resistance and increased conductance it can also provide a path for leakage between an adjacent transistor channel region and an active area, thereby increasing junction leakage. A process and structure which provides improved conductance and reduced resistance and which does not increase junction leakage would be desirable. It would be further desirable to provide a plug having a maximized amount of silicide formed thereon.

SUMMARY OF THE INVENTION

The present invention provides a new process and structure having fewer problems associated with the formation of silicided polycrystalline silicon plugs, particularly problems resulting in excessive transistor junction leakage. In accordance with one embodiment of the invention, a semiconductor substrate assembly is provided which comprises a semiconductor wafer, a plurality of transistor gates, and a plurality of conductive plugs which contact the wafer. A silicide layer is formed which simultaneously forms to contact the plurality of gates and the plurality of plugs. In another embodiment, a plug is formed which comprises silicide on the sidewalls, thereby maximizing the amount of the desirable silicide to minimize resistance.

Objects and advantages will become apparent to those skilled in the art from the following detailed description read in conjunction with the appended claims and the drawings attached hereto.

BRIEF DESCRIPTION OF THE DRAWINGS

FIG. 1 is a cross section depicting a plurality of transistor gates formed over a doped semiconductor wafer, and further depicts a plurality of dielectric layers and a mask formed thereover;

FIG. 2 is a cross section of the FIG. 1 structure after patterning the planar dielectric layer and forming of a blanket conductive layer;

FIG. 3 is a cross section of the FIG. 2 structure after planarizing the conductive layer to form a plurality of plugs;

FIG. 4 is a cross section of the FIG. 3 structure after etching the planar dielectric and after forming a refractory metal layer (which forms silicide on the conductive layer) and a protective dielectric layer over the titanium layer;

Figure 5:
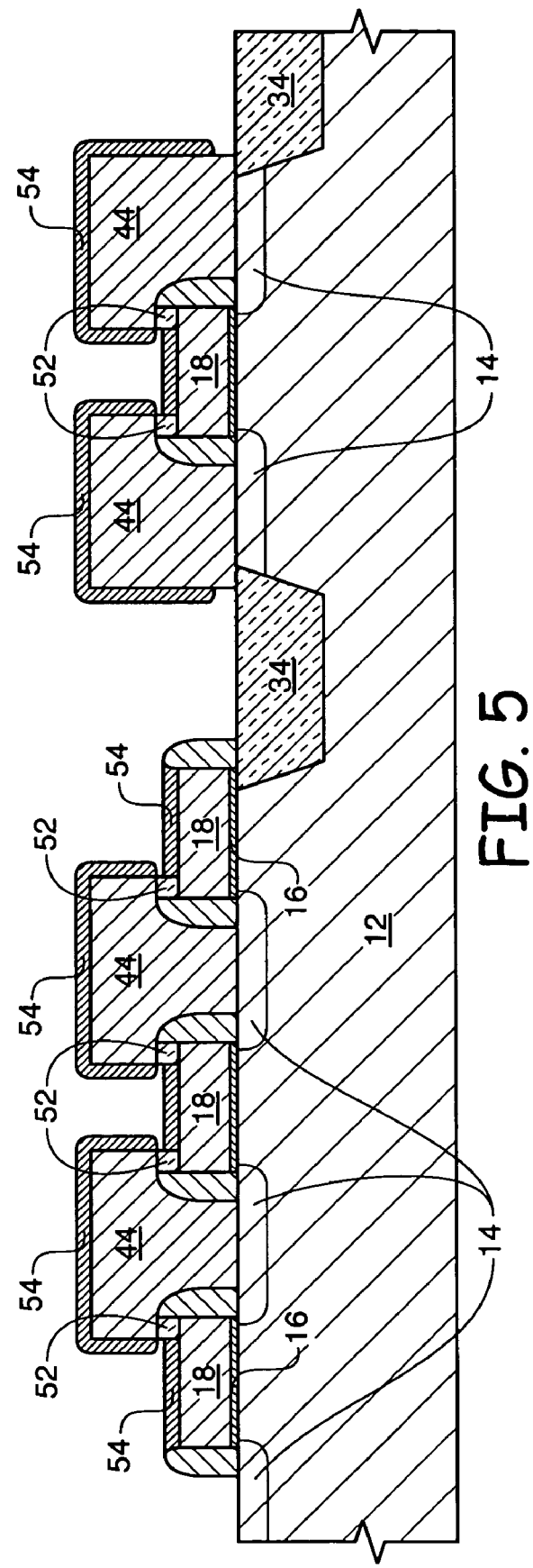
FIG. 5 is a cross section of the FIG. 4 structure after removing the protective dielectric layer and any unreacted refractory metal.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

A first embodiment of an inventive process used during the formation of a semiconductor device is depicted in FIGS. 1-5. FIG. 1 depicts a wafer substrate assembly 10 including a semiconductor wafer 12 having doped regions (active areas) therein 14, at least one transistor, and preferably a plurality of transistors, with each transistor comprising gate oxide 16 and a conductive transistor control gate portion 18. Each transistor further comprises dielectric spacers 20, for example formed from silicon nitride, and a capping layer 22, for example formed from tetraethyl orthosilicate (TEOS) or another undoped silicon dioxide layer. A TEOS layer from about 300 Å to about 800 Å thick would be sufficient.

FIG. 1 further includes a planar dielectric layer 24, for example a borophosphosilicate glass (BPSG) layer from about 4,000 Å to about 8,000 Å thick, having a mask 26 formed thereupon. Alternatively, borosilicate glass (BSG), phosphosilicate glass (PSG), or another doped silicon dioxide layer may be used. The mask layer leaves various areas of the BPSG exposed 28, for example regions between various transistors, and areas between a transistor array 30 and a periphery 32 of a semiconductor device as depicted. A shallow trench isolation area 34 separates the array 30 from the periphery. Next, the exposed BPSG 24 is removed using an etch selective to the TEOS caps 22 and nitride spacers 20 (i.e. an etch which minimizes etching of TEOS and nitride and maximizes etching of BPSG). The exposed BPSG is removed to expose the underlying layer (in the instant case, the silicon wafer 12) as depicted in FIG. 2. A wet etch such as a hydrofluoric acid (HF) dip, or a dry etch would remove the BPSG selective to nitride and TEOS.

Regarding the dry (plasma) BPSG etch selective to nitride and TEOS, one factor that affects the etch rate and the etch selectivity of the process is pressure. The total pressure has a preferred range of from about 1 millitorr to about 400 millitorr. A more preferred pressure range for a plasma etch is in a pressure range of from about 1 millitorr to about 100 millitorr. The most preferred pressure range for a plasma etch is from about 1 millitorr to about 75 millitorr. The pressure may be increased, however, above the most preferred ranges. For example the RIE etch may be performed at about 100 millitorr. Selectivity of the BPSG to the TEOS and nitride can be optimized at a pressure range between about 10 millitorr and about 75 millitorr. Pressure increases may result in a loss in selectivity. The range in selectivity, however, can be adjusted to accommodate different pressures. As such, selectivity and pressure are inversely related. Temperature is another factor that affects the selectivity of the etching process used. A preferable temperature range of the reactor cathode during the plasma etch has a range of about 10° C. to about 80° C., and more preferably about 20° C. to about 40° C. This is the temperature of a bottom electrode adjacent to the semiconductor substrate 12 during the etching process. The preferable range of the semiconductor materials is between about 40° C. and about 120° C., and more preferably between about 40° C. and about 90° C.

Undoped silicon dioxide layer 22 and nitride spacers 20 seen in FIGS. 1 and 2 protect underlying layers from the fluorinated chemical etch. As illustrated in FIG. 2, the etch will anisotropically remove the exposed portions 28 of doped BPSG layer 24. The etch removes material from the BPSG layer 24 at a higher material removal rate than that of undoped TEOS layer 22 and nitride spacers 20. Preferably, the etch has a material removal rate for substantially doped silicon dioxide (BPSG 24) that is at least 10 times higher than that of substantially undoped silicon dioxide (TEOS 22) or silicon nitride 20.

Preferably, etching as conducted according to this invention involves an anisotropic plasma etch with a fluorinated chemistry that etches through BPSG (or BSG or PSG or doped silicon dioxide in general). The etch is preferably selective to undoped silicon dioxide, silicon, and silicon nitride. The fluorinated chemical etch uses a type of carbon fluorine gas that is preferably selected from the group consisting of $C_2F_6$, $CF_4$, $C_3F_8$, $C_4F_{10}$, $C_2F_8$, $CH_2F_2$, $CHF_3$, $C_2HF_5$, $CH_3F$ and combinations thereof. There are other fluorinated etchants in a substantially gas phase that can be employed during the etching of the structure. An inert gas is often used in combination with the fluorinated etchant. Argon, nitrogen, and helium are examples of such an inert gas. The preferred gases, however, are $CF_4$, $CH_2F_2$, $CHF_3$ and Ar. Alternatively, $CH_3F$ may be used in place of $CH_2F_2$. In particular, the preferred etchant is a fluorine deficient gas which is defined as a gas where there are not enough fluorine atoms to saturate the bonding for the carbon atoms.

Next, as depicted in FIG. 2, a blanket layer of polycrystalline silicon 40 (poly) from about 1,000 Å to about 4,000 Å thick is formed over the wafer substrate assembly 10 to contact the silicon wafer 12. The poly 40 and, optionally, the BPSG 24 are planarized to remove the poly 40 from horizontal surfaces of the BPSG layer 24, for example using chemical mechanical planarization (CMP) to result in the structure of FIG. 3 having poly plugs 44 which contact the silicon wafer 12. The plugs as depicted comprise a horizontal top and a substantially vertical sidewall which intersect at about 90°.

Subsequently, the BPSG 24 is removed, for example using an HF dip, to expose the TEOS caps 22 from the transistor gates 18, but a portion of the BPSG 50 remains over the areas where the BPSG contacts the wafer as depicted in FIG. 4. Further, the exposed TEOS 22 is etched from the transistor gates 18 to expose the poly gates 18, for example using tetramethylammonium hydroxide (TMAH) and HF. Alternately, the BPSG and TEOS can be removed using a single etch which is selective to nitride and poly. A wet etch, for example using TMAH/HF, SuperQ (3% phosphoric acid, 37% ammonium fluoride), QEtch II (1% phosphoric acid, 39% ammonium fluoride), or a dry etch, for example using $CHF_3$, $CF_4$, or Argon would be sufficient. A portion of the TEOS 52 may remain, which is dependent on the alignment of the mask 26 in FIG. 1. The removal of the BPSG 24 between FIGS. 3 and 4 requires no mask, but the etch must be timed to clear the BPSG 24 from the TEOS caps 22 but to leave a portion of the BPSG 50 where the BPSG contacts the semiconductor wafer 12. Further, the TEOS 22 must be cleared to expose the gates 18.

A blanket refractory metal layer such as titanium, chromium, tantalum, platinum, tungsten, zirconium, and molybdenum, and preferably a titanium layer 54 from about 100 Å to about 400 Å thick is formed over the exposed surfaces of the assembly as depicted in FIG. 4. This includes forming the titanium over poly 18 and wafer 12 and over various dielectrics 20, 50 as depicted. A CVD deposition of titanium can be performed at a temperature between about 400° C. and 700° C. using $TiCl_4$ as a source. Using this process the titanium reacts with exposed silicon structures and remains unreacted over the dielectric structures. Next, a titanium nitride layer 56 can be formed using a CVD or PVD process to a thickness of between about 100 Å to about 500 Å. A rapid thermal anneal (RTA) step is performed to decrease the resistance of the titanium silicide, for example using a temperature between about 650° C. and about 800° C. for between about 20 seconds to about 90 seconds in a nitrogen ambient. During this step, the TiN protects the silicide from exposure to, and possible reaction with, oxygen.

Finally, the titanium nitride 56 and the unreacted titanium 54 overlying the dielectric is removed, for example using a solution of $NH_4OH$, $H_2O_2$, and water. The remaining exposed BPSG 50 over the active areas are removed using an HF dip to result in the structure of FIG. 5.

As depicted in FIG. 5, the instant process results in poly plugs 44 or other poly structures having a silicided sidewall. This results in a structure having reduced resistance compared to structures of equal size and shape having silicide only over the upper surface. Further, silicide over two or more types of structures, for example a transistor gate 18 and a poly plug 44, can be formed simultaneously which reduces manufacturing steps compared to processes which form silicide over the gate and over the plug using two or more separate steps.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

The invention claimed is:

1. A semiconductor device comprising a semiconductor substrate having a major surface, the device further comprising:
   a transistor control gate overlying the semiconductor substrate;
   a conductive plug which conductively contacts the semiconductor substrate; and
   a single silicide layer having a first portion which conductively contacts the transistor control gate and a second portion which conductively contacts the conductive plug wherein, in a plane perpendicular with the major surface, the first portion of the single silicide layer is at least partially interposed between the second portion of the silicide layer and the transistor control gate.

2. The semiconductor device of claim 1 wherein, in a plane perpendicular with the major surface, the first portion of the single silicide layer is at least partially interposed between the second portion of the silicide layer and the semiconductor substrate.

3. The semiconductor device of claim 1 wherein the device is an in-process device which further comprises the first and second portions of the silicide layer having no overlying layer which contacts the first or second portions of the silicide layer.

4. The semiconductor device of claim 1 wherein the semiconductor device is an in-process device which further comprises a blanket layer of silicon nitride overlying and contacting both the first and second portions of the silicide layer.

5. The semiconductor device of claim 1 wherein the conductive plug comprises a top and a sidewall and the second portion of the silicide layer contacts the top and the sidewall of the conductive plug.

6. The semiconductor device of claim 1 wherein the conductive plug is electrically isolated from the transistor control gate.

7. The semiconductor device of claim 1 wherein the first portion of the single silicide layer is electrically isolated from the second portion of the single silicide layer.

8. A semiconductor device comprising a semiconductor substrate having a major surface, the device further comprising:
   first and second conductive plugs;
   a conductive transistor gate interposed between the first and second conductive plugs;
   a single silicide layer comprising:
      a first portion contacting the first conductive plug;
      a second portion contacting the second conductive plug; and
      a third portion contacting the conductive transistor gate;
   wherein, in a first plane perpendicular with the major surface, the third portion of the single silicide layer is at least partially interposed between the first portion of the single silicide layer and the transistor gate, and in a second plane perpendicular with the major surface, the third portion of the single silicide layer is at least partially interposed between the second portion of the single silicide layer and the transistor gate.

9. The semiconductor device of claim 8, wherein:
   in the first plane, the third portion of the single silicide layer and the transistor gate are at least partially interposed between the first portion of the single silicide layer and the at least a portion of the semiconductor wafer; and
   in the second plane, the third portion of the single silicide layer and the transistor gate are at least partially interposed between the second portion of the single silicide layer and the at least a portion of the semiconductor substrate.

10. The semiconductor device of claim 8 further comprising:
   a first dielectric spacer interposed between and contacting both of the transistor gate and the first conductive plug; and
   a second dielectric spacer interposed between and contacting both of the transistor gate and the second conductive plug.

* * * * *